(12) United States Patent
Selzer et al.

(10) Patent No.: US 6,295,332 B1
(45) Date of Patent: Sep. 25, 2001

(54) METHOD OF IMPROVING X-RAY LITHOGRAPHY IN THE SUB 100NM RANGE TO CREATE HIGH QUALITY SEMICONDUCTOR DEVICES

(76) Inventors: Robert Allen Selzer, 21 Gregory Dr., South Burlington; William Rudolf Friml, 21 Gregory Dr., S. Burlington; Joe Baker Gagnon, 21 Gregory Dr., S. Burlington; Robert Harrison Macklin, 21 Gregory Dr., S. Burlington; Franz Ludwig Rauch, 21 Gregory Dr., S. Burlington; Heinz Siegert, 21 Gregory Dr., S. Burlington; Klaus Simon, 21 Gregory Dr., S. Burlington, all of VT (US) 05403

( * ) Notice: Subject to any disclaimer, the term of this patent is extended or adjusted under 35 U.S.C. 154(b) by 0 days.

(21) Appl. No.: 09/332,206

(22) Filed: Jun. 12, 1999

(51) Int. Cl.$^7$ ........................................ G21K 5/00
(52) U.S. Cl. ................................. 378/34; 378/35
(58) Field of Search .................... 378/34, 35, 94, 378/95, 98, 146; 340/870.35, 870.31, 870.33; 324/207.15, 73, 158

(56) References Cited

U.S. PATENT DOCUMENTS 4,697,587 * 10/1987 Burns et al. ....................... 324/73
5,497,147 * 3/1996 Arms et al. ..................... 340/870.35

* cited by examiner

*Primary Examiner*—David P. Porta
*Assistant Examiner*—Irakli Kiknadze
(74) *Attorney, Agent, or Firm*—Thomas N. Neiman

(57) ABSTRACT

The present invention is directed to the production of high quality semi-conductor devices created at speeds and in sizes that far exceed current x-ray lithography capabilities. The steps involved in the method include the use and development of horizontal beams from a synchrotron or point source of x-ray beams; preparation of submicrometer, transverse horizontal and vertical stepper stages and frames; providing a stepper base frame for the proper housing and mating of the x-ray beam; minimizing the effects of temperature and airflow control by means of a environmental chamber; transporting, handling and prealigning wafers and other similar items for tight process control; improving the control and sensing of positional accuracy through the use of differential variable reluctance transducers; controlling the continuous gap and all six degrees of freedom of the wafer being treated with a multiple variable stage control; incorporating alignment systems using unambiguous targets to provide data to align one level to the next level; beam transport, shaping or shaping devices, to include x-ray point sources; using an inline collimator or concentrator for collimating or concentrating the x-ray beams; and, imaging the mask pattern at the precise moment for optimum effectiveness.

10 Claims, 1 Drawing Sheet

Figure 1:
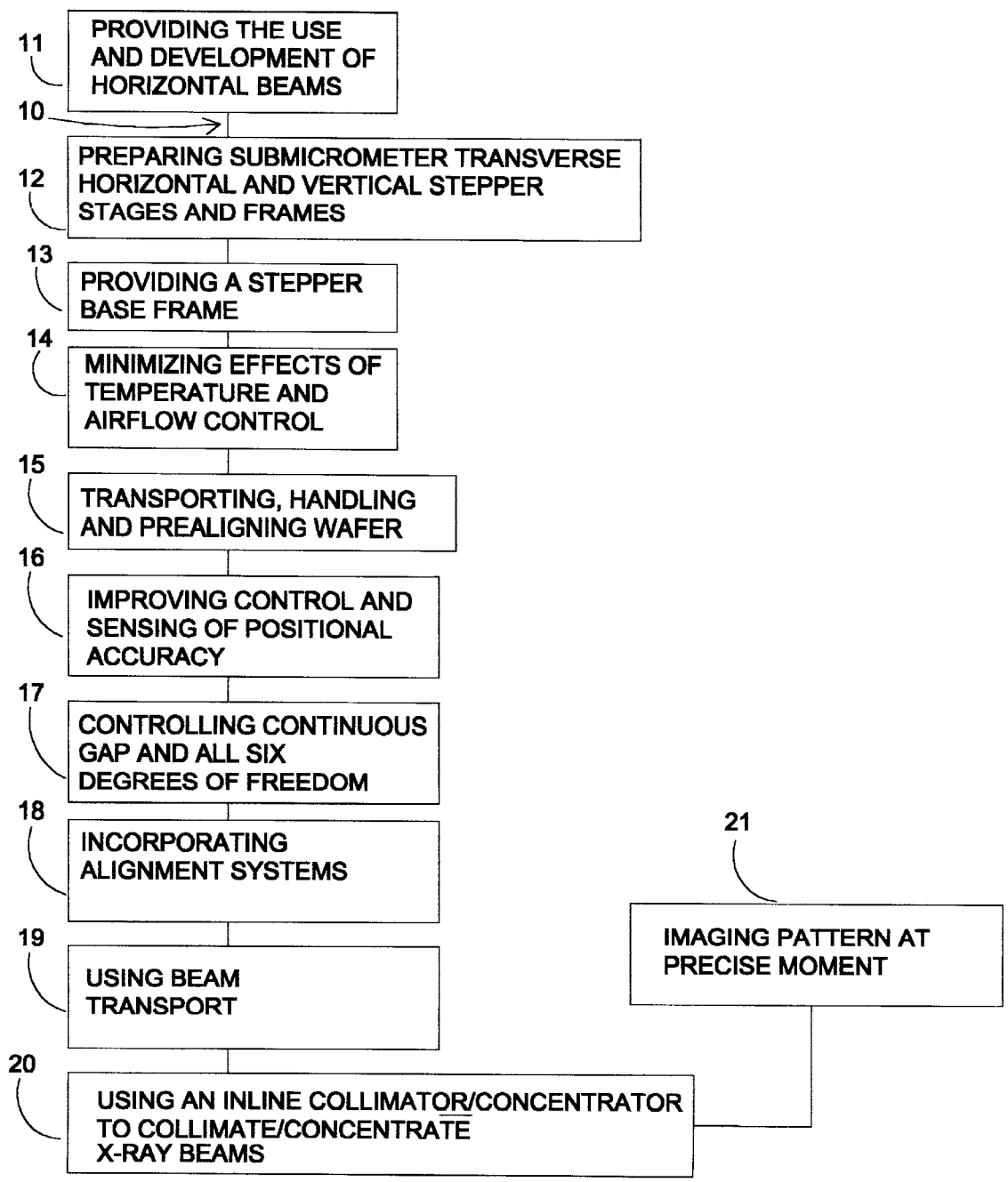

METHOD OF IMPROVING X-RAY LITHOGRAPHY IN THE SUB 100NM RANGE TO CREATE HIGH QUALITY SEMICONDUCTOR DEVICES

BACKGROUND OF THE INVENTION

This invention pertains to a method of conducting x-ray lithography and in particular, to the method of improving x-ray lithography in the sub 100 nm range to create high quality semiconductor devices for use in the manufacturing of commercial and military semiconductor devices used in phased array radar, missile seeking devices direct broadcast satellite television receivers, wide band wireless systems, global positioning satellite receivers and cellular telephones, and other equipment.

Current systems on the market today use x-ray or optical lithography to transfer a pattern from a mask to a wafer in a parallel method. The pattern is transferred from mask to wafer much faster than the serial writing of e-beam. The benefits of x-ray lithography range from a factor of 5 to about a factor of 600. Mix and match is the key to cost effective production, where most of the levels are defined by optical lithography and the critical levels are patterned using x-ray lithography. The benefits of using x-ray lithography for critical levels provide the means to ramp up production of semiconductor devices to meet not only defense requirements, but the emerging commercial requirements as well. What is needed is a new generation x-ray lithography stepper designed specifically to be integrated to an x-ray point source with an x-ray point source with the eventual addition of a collimator to further resolve features below 100 nm. It is also necessary to automate wafer and mask handling.

Clearly, it is desirable for this method to be very adaptable. At the same time, the method should be cost effective. It is the object of this invention to set forth a method of improving x-ray lithography in the sub 100 nm range to create high quality semiconductor devices which avoid the disadvantages, previously mentioned limitations of typical methods of production of current semiconductor devices.

SUMMARY OF THE INVENTION

Particularly, it is the object of this invention to teach a method of improving x-ray lithography in the sub 100 nm range to create high quality semiconductor devices, for use in the manufacturing of commercial and military semiconductor devices used in a phased array radar, missile seeking devices, direct broadcast satellite television receivers, wide band wireless systems, global positioning satellite receivers and cellular telephones, and other equipment, said method comprising the steps of providing the use and development of horizontal beams from a synchrotron or point source of x-ray beams; preparing of submicrometer, transverse horizontal and vertical stepper stages and frames; providing a stepper base frame for the proper housing and mating of the x-ray beam; minimizing the effects of temperature and airflow control by means of an environmental chamber; transporting, handling and prealigning wafers and other items for tight process control; improving the control and sensing of positional accuracy through the use of differential variable reluctance transducers; controlling the continuous gap and all six degrees of freedom of the wafer being treated with a multiple variable stage control; incorporating alignment systems using unambiguous targets to provide data to align one level to the next level; using beam transport, shaping or shaping devices to include x-ray point sources; using an inline collimator or concentrator for collimating or concentrating the x-ray beams; and imaging the pattern at the precise moment for optimum effectiveness.

BRIEF DESCRIPTION OF THE INVENTION

Further objects and features of this invention will become more apparent by reference to the following description taken in conjunction with the following figures, in which:

FIG. 1 is a block diagram of the novel method of improving x-ray lithography in the sub 100 nm range to create high quality semiconductor devices.

DESCRIPTION OF THE PREFERRED EMBODIMENTS

As shown in the FIGURE, the novel method 10 of improving x-ray lithography in the sub 100 nm range to create high quality semiconductor devices comprises the steps of providing for the use and development horizontal beams from a synchrotron or point source of x-ray beams 11. The preparation of submicrometer, transverse horizontal and vertical stepper stages and frames 12 is next. This step develops stages and frames comprised of light weight, honeycomb structure constructed of composite materials. Also, used in this step includes using air or gaseous bearings, vacuum clamping and mating surfaces, active weight compensation; linear actuators and a fine alignment flexure stage for a all six degrees of freedom. The third step provides a stepper base frame for the proper housing and mating of the x-ray beam 13. Techniques and equipment used in this step include beam alignment, vibration insulation used when connecting to a stationary x-ray synchrotron or point source.

The forth step is minimizing the effects of temperature and airflow by means of an environmental chamber 14. This unit is designed to control the temperature and humidity and, at the same time, minimize particle and molecular contamination. The fifth step is designed to transport, handle and prealign wafers and other similar items for tight process control 15. This step is required to produce high quality semiconductors. All critical wafer and mask handling and treating processes should be operated in a cluster like environment—the processes include coating, pre-baking, aligning and exposure, post baking and quality control. The sixth step is improving the control and sensing of positional accuracy through the use of differential variable reluctance transducers 16. The differential variable reluctance transducer provide a positional feedback for the six degrees of freedom alignment stage.

The next step controls the continuous gap and all six degrees of freedom of the wafer being treated with a multiple variable stage control 17. The step uses an advanced multiple variable stage control that is designed as a cross coupled gantry in order to optimize the precise alignment of the device levels. Alignment systems are then incorporated using unambiguous targets in order to align one level to the next level 18. The alignment systems consist of multiple bright fields optical microscopes, normal to the plane of imaging to provide axis x, y and z, magnification and rotational data in order to align one level with the next level. Also, an additional imaging broad band interferometer alignment system is used to provide precise alignment of wafer levels and gap control during the x-ray exposure. The following step in the process is to use beam transport shaping or shaping devices to include x-ray point sources 19. This step uses steppers to interface an x-ray source mechanical interface and a vacuum or helium tight quick coupling.

A beam transport chamber is used, either a snout design small unit or a large design integrated into the stepper base frame or as a full chamber designed for helium and or other low attenuation at atmosphere or lower pressure.

The next step 20 uses an in line collimator or concentrator for collimating or concentrating the x-ray beams, along with the use of shutter and x-ray pulse controls. Mask magnification control is provided to allow for a mix and match with optical lithography levels and techniques. Finally, in the last step 21, the process images the pattern at the precise moment for optimum effectiveness. The whole process is repeated again to image the entire wafer or substrate with the mask pattern. The wafer or substrate is removed as in step number 15 and then repeated again and again until all wafers or substrates are imaged.

While we have described our invention in connection with specific embodiments thereof, it is clearly to be understood that this is done only by way of example and not as a limitation to the scope of our invention as set forth in the objects thereof and in the appended claims.

We claim:

1. A method of improving x-ray lithography in the sub 100 nm range to create high quality semiconductor devices, for use in the manufacturing of commercial and military semiconductor devices used in phased array radar, missile seeking devices, direct broadcast satellite television receivers, wide band wireless systems, global positioning satellite receivers and cellular telephones, and other equipment said method comprising the steps of:

providing for the use and development of horizontal beams from a synchrotron or point source of x-ray beams;

preparing of submicrometer, transverse horizontal and vertical stepper stages and frames;

providing a stepper base frame for the proper housing and mating of the x-ray beam;

minimizing the effects of temperature and airflow control by means of an environmental chamber;

transporting, handling and prealigning wafers and other similar items for tight process control;

improving the control and sensing of positional accuracy through the use of differential variable reluctance transducers;

controlling the continuous gap and all six degrees of freedom of the wafer being treated with a multiple variable stage control;

incorporating alignment systems using unambiguous targets to provide data to align one level to the next;

using beam transport, shaping or shaping devices to include x-ray point sources;

using an inline collimator or concentrator for collimating or concentrating the x-ray beams; and imaging the mask pattern at the precise moment for optimum effectiveness.

2. A method of improving x-ray lithography in the sub 100 nm range to create high quality semiconductor devices, according to claim 1, wherein:

said using and developing of horizontal beams from a synchrotron or point source of x-ray beams step comprises the use of a beamline in parallel with the z axis.

3. A method of improving x-ray lithography in the sub 100 nm range to create high quality semiconductor devices, according to claim 1, wherein:

said preparing of submicrometer, transverse horizontal and vertical stepper stages and frames step comprises providing a light weight, honeycomb structure;

said preparing of submicrometer, transverse horizontal and vertical stepper stages and frames step further comprises providing a air or gaseous bearing;

said preparing of submicrometer, transverse horizontal and vertical stepper stages and frames step further comprises providing vacuum clamping and mating surfaces;

said preparing of submicrometer, transverse horizontal and vertical stepper stages and frames step further comprises providing active weight compensation;

said preparing of submicrometer, transverse horizontal and vertical stepper stages and frames step further comprises linear actuators; and said preparing of submicrometer, transverse horizontal and vertical stepper stages and frames step further comprises a fine alignment flexure stage of transverse horizontal and vertical nanometer stages.

4. A method of improving x-ray lithography in the sub 100 nm range to create high quality semiconductor devices, according to claim 3, wherein:

said providing a light weight, honeycomb structure step comprises the use of at least one composite material.

5. A method of improving x-ray lithography in the sub 100 nm range to create high quality semiconductor devices, according to claim 1, wherein:

said providing a stepper base frame for the proper housing and mating of the x-ray beam step comprises providing beam alignment and vibration insulation techniques when connecting the stationary x-ray synchrotron or point source.

6. A method of improving x-ray lithography in the sub 100 nm range to create high quality semiconductor devices, according to claim 1, wherein:

said minimizing the effects of temperature and airflow control by means of an environmental chamber step comprises controlling the temperature and humidity; and said minimizing the effects of temperature and airflow control by means of an environmental chamber step further comprises minimizing particle molecular contamination.

7. A method of improving x-ray lithography in the sub 100 nm range to create high quality semiconductor devices, according to claim 1, wherein:

said transporting handling and prealigning wafers and other similar items for tight process control step comprises using a cluster like environment in the coating, pre-baking, aligning and exposing, post baking and quality control processes.

8. A method of improving x-ray lithography in the sub 100 nm range to create high quality semiconductor devices, according to claim 1, wherein:

said improving the control and sensing of positional accuracy through the use of differential variable reluctance transducers step comprises providing positional feedback of the six degrees of freedom alignment stage.

9. A method of improving x-ray lithography in the sub 100 nm range to create high quality semiconductor devices, according to claim 1, wherein;

said controlling the continuous gap and all six degrees of freedom of the wafer being treated with a multiple variable stage control step comprises using a device having a cross coupled gantry design.

10. A method of improving x-ray lithography in the sub 100 nm range to create high quality semiconductor devices, according to claim 1, wherein:

said incorporating alignment systems using unambiguous targets to provide data to align one level to the next level step comprises using multiple bright field optical microscopes in order to provide x, y and z, magnification and rotational data; and said incorporating alignment systems using unambiguous targets to provide data to align one level to the next level step further comprises using an additional imaging broad band interferometer alignment system for providing precise alignment of wafer levels and gap controls during x-ray exposure and imaging.

* * * * *